United States Patent
Herve

(10) Patent No.: US 6,797,058 B2
(45) Date of Patent: Sep. 28, 2004

(54) PROCESS AND DEVICE FOR GROWING SINGLE CRYSTALS, ESPECIALLY OF CAF$_2$

(75) Inventor: Patrick J. P. Herve, Avon (FR)

(73) Assignee: Corning Incorporated, Corning, NY (US)

( * ) Notice: Subject to any disclaimer, the term of this patent is extended or adjusted under 35 U.S.C. 154(b) by 135 days.

(21) Appl. No.: 10/220,029

(22) PCT Filed: Feb. 6, 2001

(86) PCT No.: PCT/US01/03759

§ 371 (c)(1), (2), (4) Date: Aug. 22, 2002

(87) PCT Pub. No.: WO01/73168

PCT Pub. Date: Oct. 4, 2001

(65) Prior Publication Data

US 2003/0019422 A1 Jan. 30, 2003

(30) Foreign Application Priority Data

Mar. 24, 2000 (FR) .............................. 00 03771

(51) Int. Cl.$^7$ .............................................. C30B 11/02
(52) U.S. Cl. ................................ 117/81; 117/2; 117/83
(58) Field of Search ................................. 117/2, 81, 83

(56) References Cited

U.S. PATENT DOCUMENTS

| 5,879,452 A | * | 3/1999 | Li | ................................ | 117/208 |
| 6,042,645 A | * | 3/2000 | Li | ................................ | 117/13 |
| 6,358,314 B1 | * | 3/2002 | Li | ................................ | 117/13 |
| 6,562,126 B2 | * | 5/2003 | Price | ............................ | 117/81 |

* cited by examiner

Primary Examiner—Felisa Hiteshew
(74) Attorney, Agent, or Firm—Walter M. Douglas

(57) ABSTRACT

The present invention relates to a process and a device for growing single crystals, especially of CaF$_2$. Within the framework of said process, a stack of crucibles (100, 101, . . . , 106, . . . ) containing the starting material is successively moved translationally through a melting chamber (C1) and an annealing chamber (C2), said movement being continuous, smooth and without interruption. The present invention provides for the preparation of fluoride, single crystals, particularly optical fluoride single crystals and optical UV λ<248 nm lithography element blanks, most preferably CaF$_2$.

16 Claims, 4 Drawing Sheets

PROCESS AND DEVICE FOR GROWING SINGLE CRYSTALS, ESPECIALLY OF CAF$_2$

CROSS REFERENCE TO RELATED APPLICATIONS

This application claims the benefit of French Patent Application, Serial Number 00 03771, filed Mar. 24, 2000 entitled Process And Device For Growing Single Crystals, Especially Of Caf$_2$, by Patrick Herve.

The present invention relates to a process for growing single crystals and to an associated device suitable for carrying out said process. Said process and device are very particularly suitable for growing single crystals of calcium fluoride (CaF$_2$).

Ultra-high-performance optical systems are required to increase the level of integration of electronic components on a semiconductor wafer insofar as a radiating light of very low UV wavelength (below 248 nm) is necessary to improve the resolution.

To obtain such optical systems, the most widespread technique to date uses fused silica. Another technique already being exploited, uses single crystals of calcium fluoride (CaF$_2$).

Such single crystals or single crystals of the same type (single crystals of alkaline earth metal fluoride, in general, or even single crystals of silica) are obtained by the so-called Stockbarger or Bridgman method. In said method the crystals are generated in a furnace, inside which a crucible containing the molten material is moved from top to bottom, along a vertical axis, from a hot zone into a cold zone. The temperature of said hot zone is maintained above the melting point of the material in question (in the case of CaF$_2$ it is above 1525° C.). The crucible advances at a speed of about 0.3 to 5 mm/h.

As it passes from the hot zone to the cold zone, the material goes through a zone of high thermal gradient. Crystallization takes place inside the crucible when the material reaches the zone in which the temperature is below its melting point. The fixed crystallization front propagates inside the crucible, within the material, from bottom to top, insofar as said crucible is caused to move downwards.

To prevent any oxidation of the material and the components of the furnace, said furnace is generally maintained under vacuum. The crucible is made of a material resistant to chemical attack and is generally a graphite crucible.

In fact, said method is mainly carried out according to two variants.

According to the first variant, which is carried out batchwise, a stack of crucibles (each crucible in said stack containing the material in question) is loaded cold into the upper zone of a tower furnace, which is to become the hot zone of said furnace. The furnace, loaded in its upper zone, is heated. In a first stage, the stack of crucibles is kept hot, at a temperature above the melting point of the material in question, in said upper zone, or hot zone, of said furnace. In a second stage, said stack is lowered into and held in the lower zone, or cold zone, of said furnace, which is maintained at a temperature below that of the hot zone and below the melting point of said material in question.

The main disadvantages of this operational variant are its low productivity and mediocre yield. The productivity is hampered by dead times before and after the growth of the crystals (dead times for loading the furnace, evacuating said furnace, heating the two zones of said furnace, cooling said two zones and unloading said furnace). The yield is affected by the fact that each crucible in the stack is not exposed to the same thermal conditions over a complete cycle of said stack. In particular, the crucible at the bottom of said stack is brought into contact with the cold zone more rapidly and remains in said cold zone for longer. In addition, such discontinuous thermal conditions (hot zone/cold zone) inside one and the same furnace are difficult to control.

According to the second variant, which is described in Russian author's certificate no. 2161891 filed on Aug. 8, 1975, the aim is to carry out a continuous heat treatment. A stack of crucibles occupies the whole height of a tower furnace, which has two superposed thermal treatment chambers. When the stack undergoes a translational movement from top to bottom, each crucible in said stack passes successively through the upper chamber and then the lower chamber. For the emptying of each crucible at the bottom of the stack (the crucible which has therefore passed successively through said two thermal treatment chambers), the vertical translational movement of said stack is stopped (the crucible surmounting said crucible at the bottom of the stack being clamped between jaws for supporting and stabilizing said stack). This involves a degree of discontinuity in the thermal treatment and in any case entails decelerations and accelerations of the movement of the stack, and jerks, which are responsible for vibrations within the treated material. This is highly detrimental to optimized growth of the desired single crystals.

In such a context, the inventors designed and developed an optimized process for growing single crystals. Said process is also based on the so-called Stockbarger or Bridgman method explained above. It is optimized in that it is a truly continuous thermal treatment process which ensures that each crucible in the stack moving translationally through the furnace has the same history (very particularly as regards the thermal conditions), without jerks and with no vibration.

The prior art mentioned above and the invention mentioned below are explained only in terms of the mechanical aspect of the process (and its associated device) in question; the chemical aspect, and especially the advantageous presence of a fluorinating agent, has been generally described in the literature and is not repeated here.

The process and device of the invention are referred to in the present text as a process and device for growing single crystals. This description cannot imply a limitation. They can be described more generally as a process and device for growing crystals (polycrystals and monocrystals) insofar as they are obviously suitable for generating polycrystals. Their use for generating such polycrystals only is not excluded from the framework of the present invention (although it hardly seems pragmatic insofar as polycrystals can be obtained much more simply). The process and device of the invention can be described more precisely as a process and device for growing crystals which have been optimized to give a valuable yield of single crystals.

The process of the invention is therefore a process for growing single crystals (of the CaF$_2$, BaF$_2$, Magnesium Fluoride, optical fluoride crystals), carried out in the absence of impurities (under vacuum, in general, and/or in a controlled atmosphere) in a tower furnace inside which two superposed thermal treatment chambers are arranged, namely a first chamber, or melting chamber, and a second chamber, or annealing chamber, a sizeable thermal gradient being created between said first and second chambers.

Said process of the invention comprises:

the support and the translational movement along a vertical axis, inside said furnace, of a stack of crucibles containing the starting material (said starting material, inside each crucible, generally being introduced in the form of a powder or a previously melted disk), the height of said stack of crucibles, in operation, being greater than the sum of the heights of said superposed first and second chambers and each stack being supported and moved translationally in a direction such that each of the crucibles constituting said stack passes successively through said first chamber and then said second chamber under the action of means acting on at least the crucible at the bottom of said stack and arranged in a third chamber, or translation chamber, positioned underneath said pair of first and second chambers; and the loading of a new crucible, upstream of said first chamber, at one end of said stack, and the unloading of the crucible which has successively passed through said first and second chambers, at the other end of said stack, the loading and unloading operations being performed at the same frequency so that the height of said stack, in operation, is kept substantially constant.

As such, the process of the invention is of the same type as that described in the Russian author's certificate mentioned above. However, it can be pointed out straightaway that, in the process of the invention, the stack of crucibles can move either upwards or downwards according to the positioning of the superposed melting and annealing chambers.

In a first variant, the stack of crucibles is moved translationally from top to bottom, in which case the first (melting) chamber surmounts the second (annealing) chamber, which itself surmounts the translation chamber.

In a second variant, the stack of crucibles is moved translationally from bottom to top, in which case the first (melting) chamber surmounts the translation chamber and is positioned underneath the second (annealing) chamber.

Said first variant is a priori preferred.

The thermal conditions assured in each of the two melting and annealing chambers, and the resulting thermal gradient, are those which are necessary to obtain the expected effect, namely the formation and growth of single crystals inside the crucibles.

Characteristically, within the framework of the process of the invention as specified above, the operations of loading (of the crucibles filled with starting material) and unloading (of said filled crucibles after they have successively passed through the two superposed thermal treatment chambers) are performed without stopping the translational movement of the stack of crucibles inside the furnace. Said translational movement is executed in a perfectly continuous manner. According to the invention, said stack is driven continuously and smoothly. The heat treatment applied in this way is perfectly continuous, perfectly identical for all the crucibles and completely smooth.

The process of the invention as described above is generally started with a first stack of crucibles called a priming stack. This can be a stack of empty crucibles or straightaway a stack of filled crucibles, in which case the contents of said crucibles in said priming stack are to be discarded.

Within the framework of the implementation of the process of the invention, the stack of filled crucibles can be caused to move only with the continuous translational movement which successively conveys each crucible through the melting chamber and then through the annealing chamber. It is advantageously caused to move both with said continuous translational movement and with a rotational movement about itself. This optimizes the homogeneity of the heat treatment in the bulk of the material inside each crucible in said stack.

For the support and movement of said stack—simple translational movement or combined translational and rotational movement, in either case perfectly continuous—appropriate means, arranged in the translation chamber, act on at least the crucible at the bottom of the stack, as indicated above. Obviously, for said stack to be stable and driven perfectly, said means advantageously act on at least the two crucibles (2, 3 or even 4 crucibles) at the bottom of said stack.

Within the framework of the preferred variant of the implementation of the process of the invention, said means act on the side wall of at least the crucible at the bottom of said stack, advantageously on the side walls of at least the two crucibles (2, 3 or even 4 crucibles) at the bottom of said stack. This type of lateral action is particularly appropriate for ensuring that the stack is driven continuously and without interruption.

Reference has been made to the side wall, in the singular, of the crucibles inasmuch as the crucibles are generally cylindrical (and therefore have only one side wall). This singular in no way implies a limitation. Were parallelepipedal crucibles to be used—a priori an unlikely possibility—the means for supporting and moving the stack obviously act advantageously on at least two of the side walls (advantageously opposite walls) of at least the crucible at the bottom of the stack.

There are different possible ways of loading a new crucible and unloading a crucible which has successively passed through the two superposed thermal treatment chambers. In particular, said operations can be based on the technique described in the Russian author's certificate identified above. Advantageously, within the framework of the implementation of the process of the invention, the loading operation and/or (advantageously and) the unloading operation are (is) performed along the axis of the stack of crucibles. Said axis of the stack of crucibles preferably corresponds to the axis of the furnace inside which said stack is being conveyed.

As already indicated, the process of the invention as described in general terms above is perfectly suitable for growing (single) crystals of $CaF_2$.

Preferred variants of the implementation of said process are described later in the present text with reference to the attached Figures, without implying any limitation.

According to its second subject, the present invention relates to a device suitable for carrying out said process, i.e. a device suitable for the continuous growing of single crystals, said device comprising the following, arranged in an enclosure with a vertical axis:

three superposed chambers, namely a first thermal treatment chamber, or melting chamber, a second thermal treatment chamber, or annealing chamber, and a third chamber, or translation chamber, positioned underneath said pair of first and second chambers;

heating means, associated with each of said two thermal treatment chambers, for maintaining appropriate thermal treatment temperatures inside said chambers with a sizeable thermal gradient between said two chambers;

means for assuring the support and the translational movement along a vertical axis, through said three superposed chambers, of a stack of crucibles, said means being arranged in said third chamber, acting on at least the crucible at the bottom of said stack and assuring said translational movement in a direction such that each of the crucibles in said stack passes successively through said first chamber and then said second chamber;

means for either:
bringing said first chamber into communication with a crucible loading zone, at the top of said stack, and bringing said third chamber into communication with a crucible unloading zone, at the bottom of said stack, when said stack of crucibles is moved translationally from top to bottom; or bringing said third chamber into communication with a crucible loading zone, at the bottom of said stack, and bringing said second chamber into communication with a crucible unloading zone, at the top of said stack, when said stack of crucibles is moved translationally from bottom to top;

means for assuring the loading and unloading operations; and means for keeping said three superposed chambers and said loading and unloading zones free of impurities;

said means for assuring the support and the translational movement of said stack, said communication means and said means for assuring the loading and unloading operations cooperating so that said loading and unloading operations are assured without stopping the translational movement of said stack.

Said means cooperate in order to assure a continuous translational movement of said stack.

Said enclosure (the crystallization furnace) therefore comprises the following, from top to bottom:

in a first variant:
+the loading zone,
+the melting chamber,
+the annealing chamber,
+the translation chamber,
+the unloading zone,
in which first variant the means for assuring the support and the translational movement of the stack of crucibles assure said translational movement from top to bottom;

in a second variant:
+the unloading zone,
+the annealing chamber,
+the melting chamber,
+the translation chamber,
+the loading zone,
in which second variant the means for assuring the support and the translational movement of the stack of crucibles assure said translational movement from bottom to top.

The device of the invention is advantageously arranged according to the first variant above.

Within the framework of one or other of said variants, said three superposed melting, annealing and translation chambers advantageously have the same axis, which preferably coincides with the axis of the stack of crucibles, and said loading zone or/and (advantageously and) said unloading zone is (are) arranged along this same axis.

To obtain the expected result—the loading and unloading of crucibles without stopping the continuous translational movement of the stack of crucibles—by cooperation between the appropriate means indicated above, there are advantageously means for assuring the support and the translational movement of said stack which act on the side wall of at least the crucible at the bottom of said stack, and which advantageously act on the side walls of at least the two crucibles at the bottom of said stack.

Said means which assure the support and the continuous translational movement of said stack constitute the key means of the device of the invention. They can exist in different forms. In particular, they can be suitable for assuring only a simple translational movement of said stack; they can also be suitable for assuring both a translational movement and a rotational movement of said stack about itself.

Three types of such means are specified below by way of illustration. The first two types are suitable for a simple translational movement and the third is suitable for translational movement combined with rotational movement.

Said means for assuring the support and the continuous translational movement of the stack of crucibles inside the enclosure with a vertical axis (tower furnace) can comprise the following in particular:

at least one set of at least two rollers with horizontal axes, acting on the side wall of the crucible at the bottom of the stack, and advantageously, in addition to said set of rollers, at least one other set of rollers of the same type, acting on at least one other crucible at the bottom of the stack (advantageously acting on the crucible directly above said crucible at the bottom of said stack). The set(s) of such rollers advantageously comprises (comprise) four rollers 90° apart. It is thus recommended to use two superposed sets (the one acting on the crucible at the bottom of the stack and the other acting on the crucible just above) of four rollers each, made of a suitable material (1st type).

at least two sets of at least two jaws each, each of said sets of jaws being suitable for assuring the support of said stack by clamping of the crucible at the bottom of said stack and being capable of being retracted from said stack and caused to move translationally along a vertical axis, in alternation with the other set of jaws, in order to assure the continuous translational movement of said stack (2nd type).

Said means for assuring the support and the continuous translational/rotational movement of the stack of crucibles inside the enclosure with a vertical axis (tower furnace) can comprise the following in particular:

at least one set of at least two rollers, whose axis is slightly inclined relative to the vertical, acting on the side wall of the crucible at the bottom of said stack, and advantageously, in addition to said set of rollers, at least one other set of rollers of the same type, acting on at least one other crucible at the bottom of said stack (advantageously acting on the crucible directly above said crucible at the bottom of said stack). The set(s) of such rollers advantageously comprises (comprise) three rollers 120° apart, made of a suitable material (3rd type). To drive the stack of crucibles with a rotational movement during its translational movement, each of the rollers in such a set is offset by an angle $\alpha$ relative to said stack. Each of said rollers actually rotates about an axis which is therefore not parallel to the longitudinal vertical axis of the device, nor does it intersect with said axis.

Preferred variants of the device of the invention are described in greater detail below with reference to the attached Figures.

In fact, it is now proposed to describe the invention both in terms of the process and in terms of the device, with reference to the attached Figures.

Figure 1:
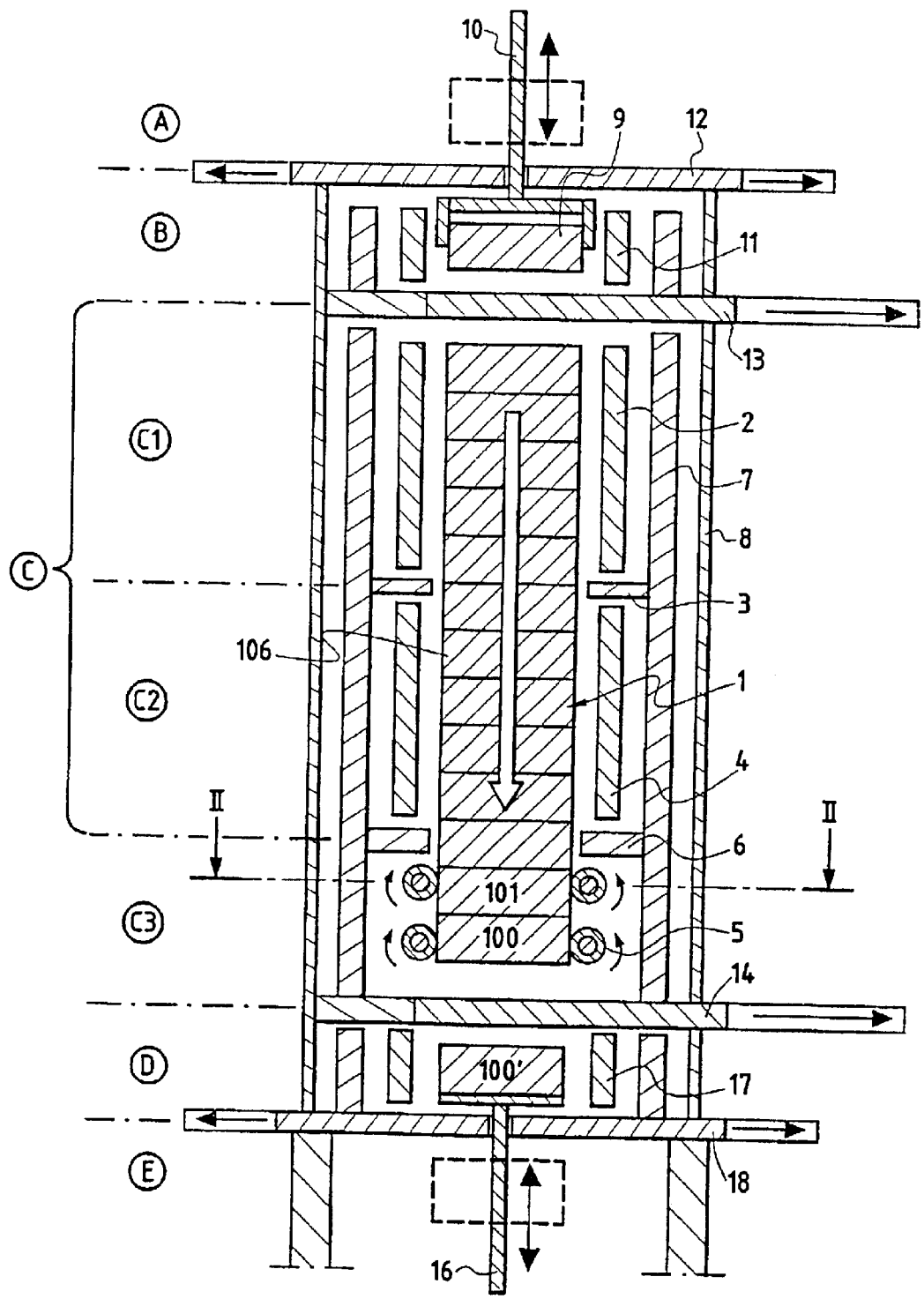
FIG. 1 is a longitudinal section of a device (furnace for growing single crystals) of the invention, equipped with a first type of means for assuring the support and the continuous (simple) translational movement of the stack of crucibles.

The process and device of the invention are described below with reference to FIG. 1. Said FIG. 1 shows a furnace of the invention.

The external structure of said furnace is delimited by a water-cooled outer jacket 8 which isolates the atmosphere of said furnace from the ambient atmosphere. Said external structure also includes a heat shield 7 made of fibrous graphite, positioned "at a distance" from the electric heating elements 2 and 4. Said heat shield 7 protects the outer jacket 8 from the thermal radiation.

Inside said furnace there are the following three superposed chambers:

the melting chamber C1, the annealing chamber C2, the translation chamber C3, and, in line with said three chambers:

above: the loading zone B, below: the unloading zone D.

In fact, one could speak more precisely of loading with reference to zone A, conditioning with reference to zone B, unloading with reference to zone E and deconditioning with reference to zone D (cf. below for the description of the process).

The stack 1 of crucibles (100, 101, . . . , 106, . . . ) is heat-treated in zone C=C1+C2. As shown in FIG. 1, said stack 1 is continuously moved translationally from top to bottom. It is actually supported and moved translationally by a translation mechanism comprising two sets of horizontal rollers 5.

The powdered material inside the crucibles is melted in the upper melting zone C1 heated by the graphite electric heating elements 2. Said molten material then cools slightly on passing from said melting zone C1 to the annealing zone C2, itself heated by other heating elements 4 of the same type. The temperature gradient inside the furnace, between said zones C1 and C2, is obtained by means of a diaphragm 3, which partially isolates said "hot" zone C1 from said "cold" zone C2. Provision can be made for cold water to circulate inside said diaphragm 3 in order to obtain a gradient of more sizeable intensity. On passing through this zone, the temperature transition inside the material, in each crucible, creates a stationary crystallization front.

The translation chamber C3 is colder than the annealing chamber C2. A second diaphragm 6, which again can be cooled by water circulation, is inserted to partially isolate said chamber C3 from said chamber C2. Said diaphragm 6 thus protects the rollers 5 from excessive heat. Said rollers 5 are advantageously coated with silicone, thereby improving the friction with the crucibles (100, 101, . . . , 106, . . . ). Two sets of four rollers 5 are used in the variant shown, namely a first set acting on the crucible 100 at the bottom of the stack, and a second set acting on the crucible 101. This gives the stack 1 of crucibles a good stability in all directions and also drives said stack perfectly, with a translational movement, from top to bottom.

Figure 2:
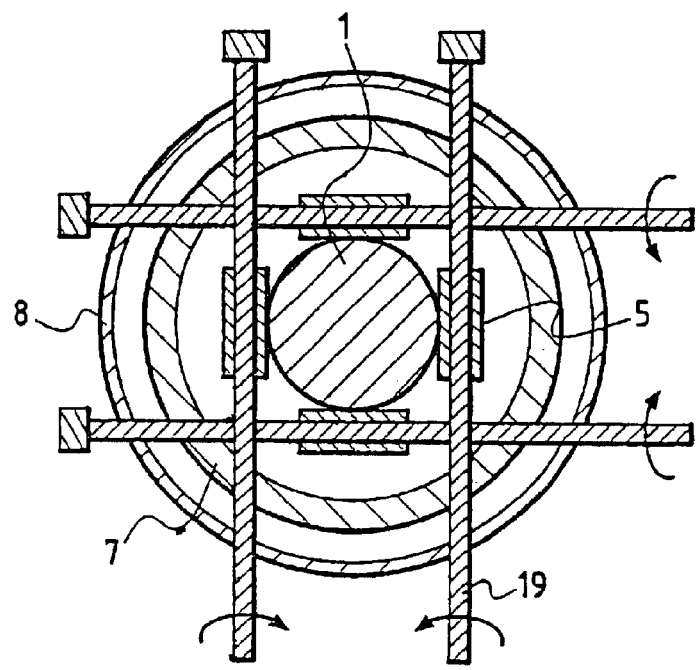
FIG. 2 is a section along II—II of said FIG. 1, showing said means in detail.

One of these sets of four horizontal rollers is shown perfectly in FIG. 2. Each roller 5 is driven by a shaft 19 passing through the outer jacket 8 of the furnace and also through the heat shield 7. The passages through said jacket 8 are made perfectly leaktight, said furnace generally operating under vacuum. All the bearings and mechanical drive devices are located outside said furnace. The two sets of four shafts 19 are coupled by gear trains and caused to rotate by a single motor (not shown) so as to assure a simple and reliable synchronization of the rotation of the rollers 5.

The device of the invention as shown in these FIGS. 1 and 2 functions in the following manner.

A new crucible 9 is periodically loaded inside. When the loading zone B (lock chamber) is at ambient temperature and pressure, two symmetrical doors 12 are advantageously opened and a support 10 moves up into the grabbing position in order to seize said new crucible 9. Said support 10, with said crucible 9, moves back down into zone B. The two doors 12 close. The interior of said zone B is evacuated by means of a pump (not shown) and the temperature is increased by means of the electric heating elements 11, which are similar to the electric heating elements 2 and 4 located inside the furnace. When the pressure and temperature conditions inside zone B are similar to those of the melting chamber C, the door 13 opens automatically and the new crucible 9 is loaded on top of the stack 1. The support 10 then retracts inside zone B and the door 13 is closed again. Said zone B is returned to ambient temperature and pressure.

A similar but reverse procedure is used for unloading at the bottom of the stack 1. When the crucible 100 at the bottom of the stack 1 is ready to leave the rollers 5, the door 14 opens automatically. A support 16 then moves up to receive said crucible 100. Said support 16, with said crucible, moves back down into the unloading zone D (lock chamber placed under the same pressure and temperature conditions as the translation chamber C3). The temperature is raised by means of the electric heating elements 17. The door 14 then closes and said zone D can be returned to ambient temperature and pressure. The crucible thereby separated from the stack 1 has been given reference number 100' in FIG. 1. When zone D is at ambient temperature and pressure, the double door 18 opens, the support 16 moves down and the crucible 100' can be recovered. The support 16 then moves up into zone D to adopt the waiting position for the crucible 100. The double door 18 is closed again and said zone D is placed under the same temperature and pressure conditions as the translation chamber C3.

Figure 3:
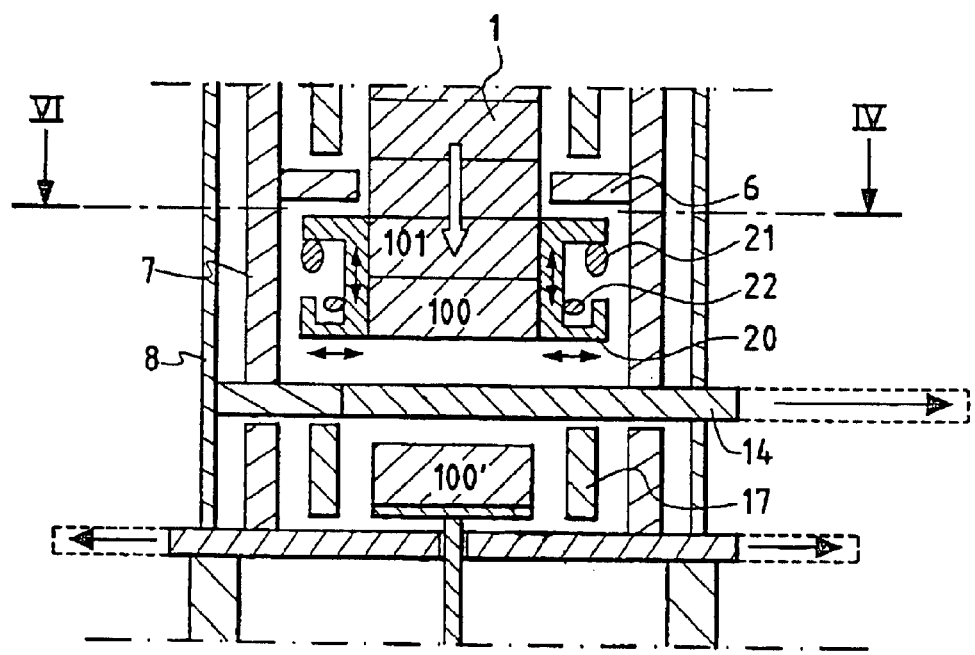
FIG. 3 is a partial longitudinal section of a device of the invention, equipped with a second type of means for assuring the support and the continuous (simple) translational movement of the stack of crucibles.
Figure 5:
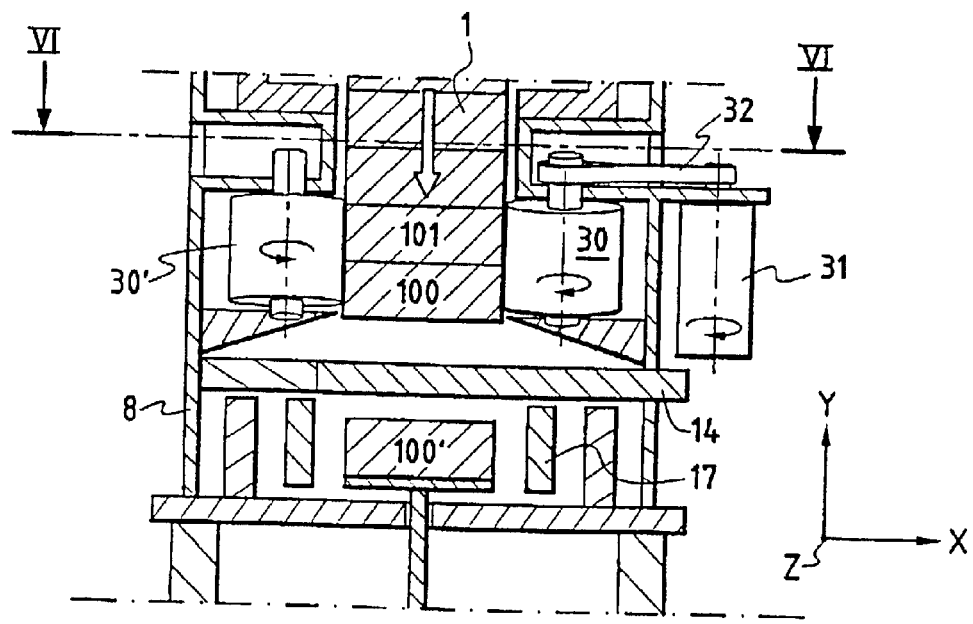
FIG. 5 is a partial longitudinal section of a device of the invention, equipped with a third type of means for assuring the support and the translational movement (associated with rotational movement) of the stack of crucibles.

The devices according to FIGS. 3 and 5 function similarly but with different means for assuring the support and the continuous translational movement of the stack 1 of crucibles.

Figure 4:
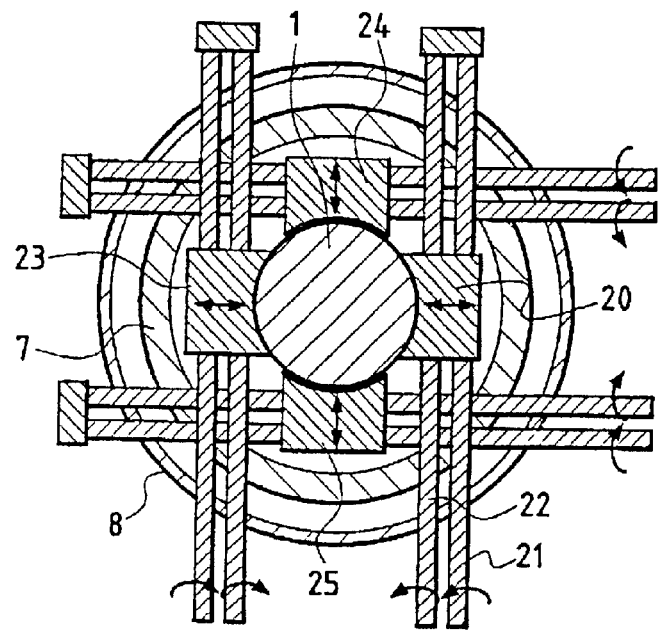
FIG. 4 is a section along IV—IV of said FIG. 3, showing said means in detail.

In exactly the same way as the means shown in FIGS. 1 and 2, the means shown in FIGS. 3 and 4 assure a simple translational movement of the stack 1 of crucibles. Said means according to FIGS. 3 and 4 are more complex than those according to FIGS. 1 and 2, but they have the advantage of acting without exerting any rolling action or friction on the crucibles. Said means according to FIGS. 3 and 4 comprise four jaws 20, 23, 24 and 25, which are suitable for holding the stack of crucibles and moving it downwards. The movements of these jaws 20, 23, 24 and 25 are not rotational movements but mechanically synchronized, successive vertical and radial (horizontal) translational movements.

The jaws 20 and 23, which are diametrically opposite one another, function in alternation with the jaws 24 and 25, which are also diametrically opposite one another. FIG. 4 clearly shows the jaws 20 and 23, which are driving the stack 1 downwards, whereas the jaws 24 and 25 are no longer in contact with said stack 1 and are moving upwards. Before said jaws 20 and 23 reach their low position, said jaws 24 and 25 are clamped against said stack 1, continuously ensuring that the latter is supported and conveyed downwards. Said jaws 20 and 23 are then retracted radially and moved upwards.

Each jaw is independently activated for its two types of movement (horizontal and vertical movements) by means of shafts and cams. Thus the cam 21 participates in the vertical translational movement of the jaw 20 and the cam 22 participates in its radial translational movement. It is advantageous to use such cams insofar as all the drive movements are thus rotational movements. The passage through the heat shield 7 and the outer jacket 8 for the shafts involved does not present a real problem of leaktightness.

The synchronization of the movements of all the jaws can be achieved either mechanically with a single motor and appropriate gears, or by using brushless motors with precision control feedback.

Figure 6:
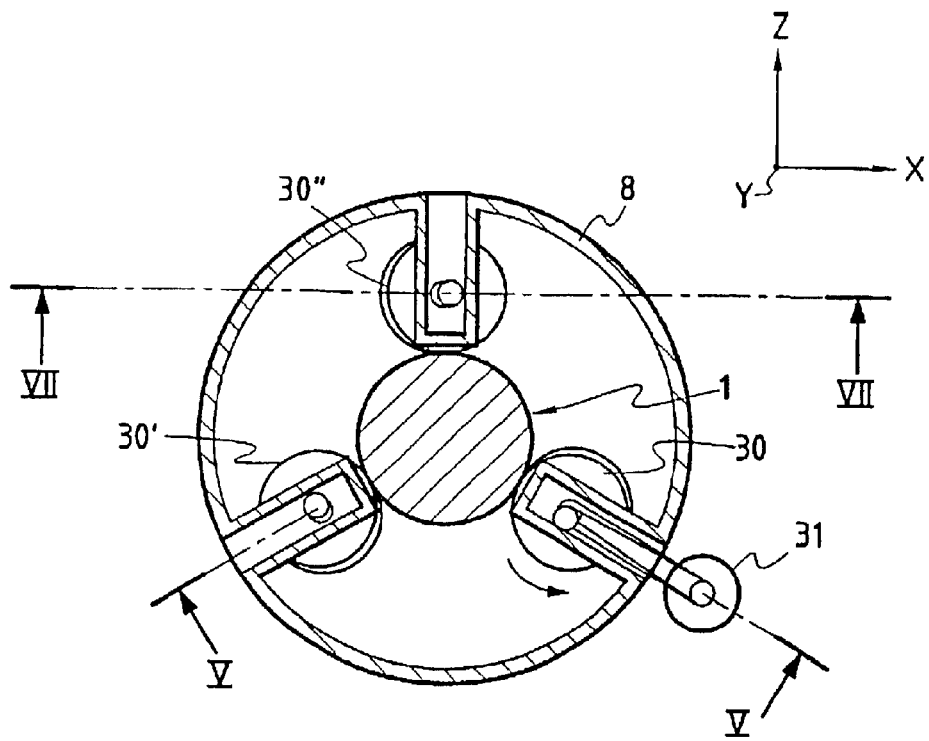
FIG. 6 is a section along VI—VI of said FIG. 5, showing said means in detail.
Figure 7:
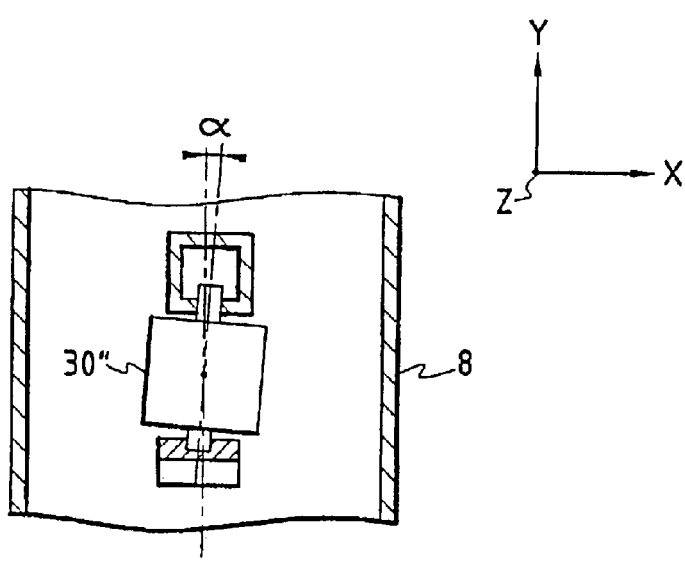
FIG. 7 is a section along VII—VII of said FIG. 6.

The device according to FIGS. 5, 6 and 7 incorporates means, in the translation chamber C3, which are suitable for assuring the support and the continuous translational movement, with rotation, of the stack 1 of crucibles.

Said means consist of three rollers 30, 30' and 30". The axis of each of said rollers 30, 30' and 30" is slightly inclined relative to the vertical. The angle of inclination has been given the reference α in FIG. 7 and develops in the plane (YOZ). The angle of inclination is generally in the order of one degree. One of said rollers—the roller 30—is caused to rotate by the motor 31 via the transmission means 32 of the belt or chain type. The other two rollers, 30' and 30", are free.

The invention can also be described precisely, purely by way of illustration, by the data below.

A furnace of the type shown diagrammatically in the attached Figures is used for growing single crystals of $CaF_2$.

The overall size of said furnace is in the order of 2 to 3 meters and its diameter is about 1 meter. Graphite crucibles are used. They have a diameter of 300 to 400 mm and a height of about 100 mm. The output of the furnace is about one crucible per day or one crucible every other day.

The temperatures in the different chambers of said furnace are as follows:

>1525° C. for the melting chamber (upper chamber),

<1525° C. for the annealing chamber (intermediate chamber with the top part at 1200–1500° C. and the bottom part at 200–300° C.), and below 200° C. for the translation chamber (lower chamber).

What is claimed is:

1. A process for growing fluoride crystals, carried out in the absence of impurities in a tower furnace inside which two superposed thermal treatment chambers are arranged, namely a first melting chamber, and a second annealing chamber, a sizeable thermal gradient being created between said first and second chambers, said process comprising:

the support and the translational movement along a vertical axis, inside said furnace, of a stack of crucibles containing the starting material, the height of said stack of crucibles, in operation, being greater than the sum of the heights of said superposed first and second chambers and said stack being supported and moved translationally in a direction such that each of the crucibles constituting said stack passes successively through said first chamber and then said second chamber under the action of means acting on at least the crucible at the bottom of said stack and arranged in a third chamber, or translation chamber, positioned underneath said pair of first and second chambers; and the loading of a new crucible, upstream of said first chamber, at one end of said stack, and the unloading of the crucible which has successively passed through said first and second chambers, at the other end of said stack, the loading and unloading operations being performed at the same frequency so that the height of said stack, in operation, is kept substantially constant;

said growing process being characterized in that said translational movement of said stack is continuous, said loading and unloading operations being performed without stopping said translational movement; and wherein with translational movement of said stack of crucibles, said stack of crucibles also rotates about itself.

2. The process according to claim 1, wherein said stack of crucibles is supported and caused to move, with a translational movement, under the action of means acting on the side wall of at least the crucible at the bottom of said stack.

3. The process according to claim 1, wherein the loading operation is performed along the axis of said stack.

4. The process according to claim 1, wherein said process is carried out in to grow $CaF_2$ crystals.

5. A process of making UV λ<248 nm optical element fluoride crystal blanks, said making carried out in the absence of impurities in a tower furnace inside which two superposed thermal treatment chambers are arranged, namely a first chamber, and a second chamber, a sizeable thermal gradient being created between said first and second chambers said making including:

providing a support and a translational movement along a vertical axis, inside said furnace, of a stack of crucibles containing starting crystal material, the height of said stack of crucibles in operation, being greater than the sum of the heights of said superposed first and second chambers and said stack being supported and moved translationally in a direction such that each of the crucibles constituting said stack passes successively through said first chamber and then said second chamber with an action acting on at least the crucible at the bottom of said stack and arranged in a third chamber, positioned underneath said pair of first and second chambers; and loading of a new crucible, upstream of said first chamber, at one end of said stack, and unloading of the crucible which has successively passed through said first and second chambers, at the other end of said stack, the loading and unloading being performed at the same frequency so that the height of said stack, in operation, is kept substantially constant;

and growing said fluoride crystal blanks such that said translational movement of said stack is continuous, said loading and unloading operations being performed without stopping said translational movement.

6. The process according to claim 5, wherein said process also comprises the rotation about itself of said stack of crucibles in translational movement.

7. The process according to claim 5, wherein said stack of crucibles is supported and caused to move, with a simple translational movement or a translational and rotational movement, under an action of means acting on the side wall of at least the crucible at the bottom of said stack, advantageously on the side walls of at least the two crucibles at the bottom of said stack.

8. the process according to claim 5, wherein the loading operation is performed along the axis of said stack.

9. The process according to claim 5, wherein the process is carried out in order to grow $CaF_2$ crystals.

10. A device suitable for the continuous growing of fluoride crystals, comprising the following, arranged in an enclosure with a vertical axis:

three superposed chambers, namely a first thermal treatment melting chamber, a second thermal treatment, or annealing chamber, and a third translation chamber, positioned underneath said pair of first and second chambers;

heating means associated with each of said two thermal treatment chambers, for maintaining appropriate thermal treatment temperatures inside said chambers with a sizeable thermal gradient between said two chambers;

means for assuring the support and the translational movement along a vertical axis, through said three superposed chambers of a stack of crucibles, said means being arranged in said third chamber, acting on at least the crucible at the bottom of said stack and assuring said translational movement in a direction such that each of the crucibles in said stack passes successively through said first chamber and then said second chamber;

means for bringing said first chamber into communication with a crucible loading zone, at the top of said stack, and bringing said third chamber into communication with a crucible unloading zone, at the bottom of said stack, when said stack of crucibles is moved translationally from top to bottom;

means for assuring the loading and unloading operations; and means for keeping said three superposed chambers and said loading and unloading zones free of impurities; and characterized in that said means for assuring the support and the translational movement of said stack, said communication means and said means for assuring the loading and unloading operations cooperate so that said loading and unloading operations are assured without stopping the translational movement of said stack;

wherein said means for assuring the support and the translational movement of said stack act on the side wall of at least the crucible at the bottom of said stack.

11. The device according to claim 10, wherein said three chambers have the same axis.

12. The device according to claim 10, characterized in that said means for assuring the support and the translational movement of said stack comprise at least one set of at least two rollers with horizontal axes, acting on the side wall of the crucible at the bottom of the stack.

13. The device according to claim 10, characterized in that said means for assuring the support and the translational movement of said stack comprise at least two sets of at least two jaws each, each of said sets of jaws being suitable for assuring the support of said stack by clamping of the crucible at the bottom of said stack and being capable of being refracted from said stack and caused to move translationally along a vertical axis, in alternation with the other set of jaws, in order to assure the translational movement of said stack (1).

14. The device according to claim 10, wherein means which assure the support and the continuous translational movement of said stack also assure the rotation of said stack about itself.

15. Device according to claim 14, wherein said means comprise at least one set of at least two rollers, whose axis is slightly inclined ($\alpha$) relative to the vertical, acting on the side wall of the crucible at the bottom of said stack.

16. A tower furnace for the continuous growing of UV $\lambda<248$ nm optical element fluoride crystal blanks, comprising the following, arranged in an enclosure with a vertical axis:

three superposed chambers, namely a first thermal treatment melting chamber, a second thermal treatment chamber, and a third chamber, positioned underneath said pair of first and second chambers;

a plurality of heaters, associated with said two thermal treatment chambers, for maintaining appropriate thermal treatment temperatures inside said chambers with a sizeable thermal gradient between said two chambers;

a translational support, said translational support providing translational movement along a vertical axis, through said three superposed chambers, of a stack of crucibles said support being arranged in said third chamber, acting on at least the crucible at the bottom of said stack and assuring said translational movement in a direction such that each of the crucibles in said stack passes successively through said first chamber and then said second chamber;

at least one furnace member, said member bringing said first chamber into communication with a crucible loading zone, at the top of said stack, and bringing said third chamber into communication with a crucible unloading zone, at the bottom of said stack, when said stack of crucibles is moved translationally from top to bottom; or a loading member, said loading member for assuring the loading and unloading operations; and an impurity inhibitor for keeping said three superposed chambers and said loading and unloading zones free of impurities;

said furnace providing the support and the translational movement of said stack, and the loading and unloading operations wherein said loading and unloading operations are assured without stopping the translational movement of said stack.

* * * * *

UNITED STATES PATENT AND TRADEMARK OFFICE
CERTIFICATE OF CORRECTION

PATENT NO. : 6,797,058 B2
DATED : September 28, 2004
INVENTOR(S) : Herve, Patrick It is certified that error appears in the above-identified patent and that said Letters Patent is hereby corrected as shown below:

Column 12,
Line 7, "being refrated" should read -- being retracted --

Signed and Sealed this

Fifth Day of April, 2005

JON W. DUDAS
*Director of the United States Patent and Trademark Office*